(12) United States Patent
Kim et al.

(10) Patent No.: US 9,780,074 B2
(45) Date of Patent: Oct. 3, 2017

(54) SEMICONDUCTOR PACKAGE USING A CORELESS SIGNAL DISTRIBUTION STRUCTURE

(71) Applicant: Amkor Technology, Inc., Tempe, AZ (US)

(72) Inventors: Do Hyung Kim, Gyeonggi-do (KR); Jung Soo Park, Gyeonggi-do (KR); Seung Chul Han, Gyeonggi-do (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/018,668

(22) Filed: Feb. 8, 2016

(65) Prior Publication Data

US 2016/0233196 A1    Aug. 11, 2016

(30) Foreign Application Priority Data

Feb. 9, 2015    (KR) .......................... 10-2015-0019458

(51) Int. Cl.
*H01L 29/49* (2006.01)
*H01L 25/065* (2006.01)
(Continued)

(52) U.S. Cl.
CPC ........ *H01L 25/0657* (2013.01); *H01L 21/563* (2013.01); *H01L 21/568* (2013.01); *H01L 21/6835* (2013.01); *H01L 23/3128* (2013.01); *H01L 23/3135* (2013.01); *H01L 23/3185* (2013.01); *H01L 24/12* (2013.01);
(Continued)

(58) Field of Classification Search
CPC . H01L 25/0657; H01L 21/563; H01L 21/568; H01L 21/6835
See application file for complete search history.

(56) References Cited

FOREIGN PATENT DOCUMENTS

| JP | 2011082293 A | 4/2011 |
|---|---|---|
| KR | 20030083553 A | 10/2003 |

(Continued)

OTHER PUBLICATIONS

Korean Office Action dated Feb. 26, 2016 for Korean Patent Application No. 10-2015-0019458.
(Continued)

*Primary Examiner* — Michael Shingleton
(74) *Attorney, Agent, or Firm* — McAndrews, Held & Malloy, Ltd.

(57) ABSTRACT

A semiconductor package using a coreless signal distribution structure (CSDS) is disclosed and may include a CSDS comprising at least one dielectric layer, at least one conductive layer, a first surface, and a second surface opposite to the first surface. The semiconductor package may also include a first semiconductor die having a first bond pad on a first die surface, where the first semiconductor die is bonded to the first surface of the CSDS via the first bond pad, and a second semiconductor die having a second bond pad on a second die surface, where the second semiconductor die is bonded to the second surface of the CSDS via the second bond pad. The semiconductor package may further include a metal post electrically coupled to the first surface of the CSDS, and a first encapsulant material encapsulating side surfaces and a surface opposite the first die surface of the first semiconductor die, the metal post, and a portion of the first surface of the CSDS.

16 Claims, 6 Drawing Sheets

(51) Int. Cl.
  *H01L 23/31*     (2006.01)
  *H01L 25/00*     (2006.01)
  *H01L 21/56*     (2006.01)
  *H01L 21/683*    (2006.01)
  *H01L 23/00*     (2006.01)
  *H01L 23/544*    (2006.01)

(52) U.S. Cl.
  CPC .............. *H01L 24/81* (2013.01); *H01L 24/97* (2013.01); *H01L 25/50* (2013.01); *H01L 23/544* (2013.01); *H01L 2221/68318* (2013.01); *H01L 2221/68345* (2013.01); *H01L 2221/68359* (2013.01); *H01L 2221/68381* (2013.01); *H01L 2223/54406* (2013.01); *H01L 2223/54433* (2013.01); *H01L 2224/16227* (2013.01); *H01L 2224/73204* (2013.01); *H01L 2224/81005* (2013.01); *H01L 2224/83005* (2013.01); *H01L 2224/97* (2013.01); *H01L 2225/06524* (2013.01); *H01L 2225/06548* (2013.01); *H01L 2225/06586* (2013.01); *H01L 2924/1531* (2013.01); *H01L 2924/18161* (2013.01)

(56)         References Cited

FOREIGN PATENT DOCUMENTS

KR    20120032772 A    4/2012
KR    20140002458 A    1/2014

OTHER PUBLICATIONS

Korean Notice of Allowance dated Oct. 19, 2016 for Korean Patent Application No. 10-2015-0019458.

SEMICONDUCTOR PACKAGE USING A CORELESS SIGNAL DISTRIBUTION STRUCTURE

CROSS REFERENCE TO RELATED APPLICATIONS

The present application makes reference to, claims priority to, and claims the benefit of Korean Patent Application No. 10-2015-0019458, filed on Feb. 9, 2015, the contents of which are hereby incorporated herein by reference, in their entirety.

FIELD

Certain example embodiments of the disclosure relate to semiconductor chip packaging. More specifically, certain example embodiments of the disclosure relate to a semiconductor package using a coreless signal distribution structure.

BACKGROUND

Present semiconductor packages and methods for forming semiconductor packages (e.g. multi-dimensional packages and methods utilizing interposer technology with through-silicon vias) are inadequate, for example resulting in excess cost, decreased reliability, or package sizes that are too large. For example, current interposer technology Further limitations and disadvantages of conventional and traditional approaches will become apparent to one of skill in the art, through comparison of such approaches with the present disclosure as set forth in the remainder of the present application with reference to the drawings.

Further limitations and disadvantages of conventional and traditional approaches will become apparent to one of skill in the art, through comparison of such systems with the present disclosure as set forth in the remainder of the present application with reference to the drawings.

BRIEF SUMMARY

Various aspects of the present disclosure provide a semiconductor package, and a method of manufacturing thereof. For example and without limitation, various aspects of the present disclosure provide a three-dimensional semiconductor package, using a coreless signal distribution structure, and a method of manufacturing thereof, substantially as shown in and/or described in connection with at least one of the figures, as set forth more completely in the claims.

Various advantages, aspects and novel features of the present disclosure, as well as details of various illustrated example supporting embodiments, will be more fully understood from the following description and drawings.

DETAILED DESCRIPTION

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example a semiconductor device or package may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated.

Certain aspects of the disclosure may be found in a semiconductor package comprising a coreless signal distribution structure. Example aspects of the disclosure may comprise a coreless signal distribution structure comprising at least one dielectric layer, at least one conductive layer, a first surface, and a second surface opposite to the first surface. The semiconductor package may also comprise a first semiconductor die having a first bond pad on a first die surface, where the first semiconductor die is bonded to the first surface of the coreless signal distribution structure via the first bond pad, and a second semiconductor die having a second bond pad on a second die surface, where the second semiconductor die bonded to the second surface of the coreless signal distribution structure via the second bond pad. The semiconductor package may further comprise a metal post electrically coupled to the first surface of the coreless signal distribution structure, and a first encapsulant material encapsulating side surfaces of the first semiconductor die, the metal post, and a portion of the first surface of the coreless signal distribution structure, where a surface of the first encapsulant material is coplanar with a surface of the first semiconductor die opposite the first die surface of the semiconductor die. The metal post may comprise copper and extend through the encapsulant material. A second encapsulant material may encapsulate the second semiconductor die. A second metal post may be coupled to the coreless signal distribution structure and extend through the second encapsulant material. A surface of the second encapsulant may be coplanar with a surface of the second semiconductor die opposite the second die surface. A conductive pillar may electrically couple the first bond pad of the first semiconductor die to the coreless signal distribution structure. A redistribution structure may be on the first encapsulant and electrically coupled to the metal post, wherein the redistribution structure may comprise at least one conductive layer and at least one dielectric layer. The redistribution structure may, for example, comprise a linewidth of 1-10 µm.

Referring to FIGS. 1A through 1K, cross-sectional views illustrating a method of manufacturing a semiconductor device 100 according to an embodiment of the present disclosure are illustrated.

Figure 1A:
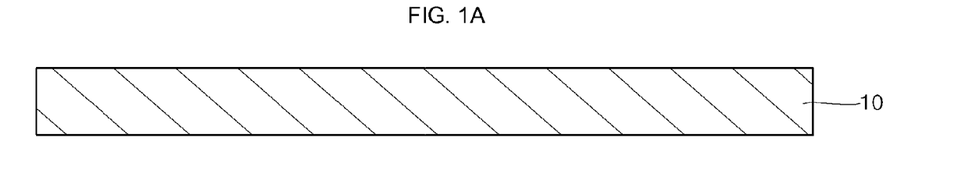
FIGS. 1A through 1K are cross-sectional views illustrating a method of manufacturing a semiconductor device according to an embodiment of the present disclosure.
Figure 1B:
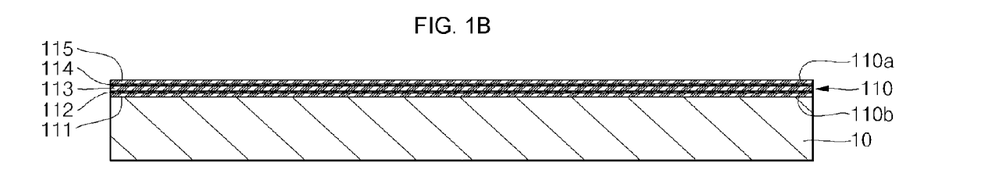
Figure 1C:
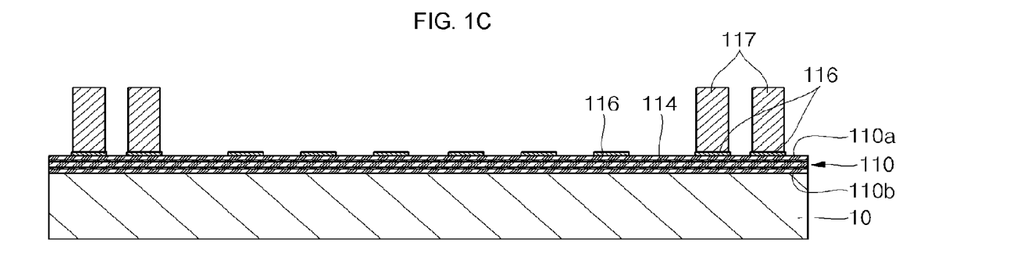
Figure 1D:
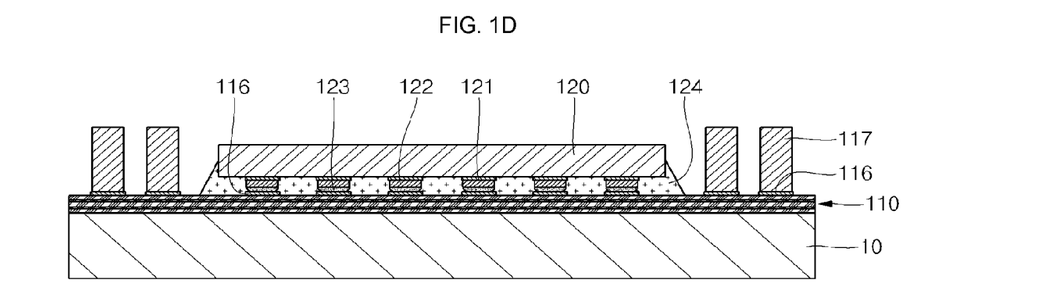
Figure 1E:
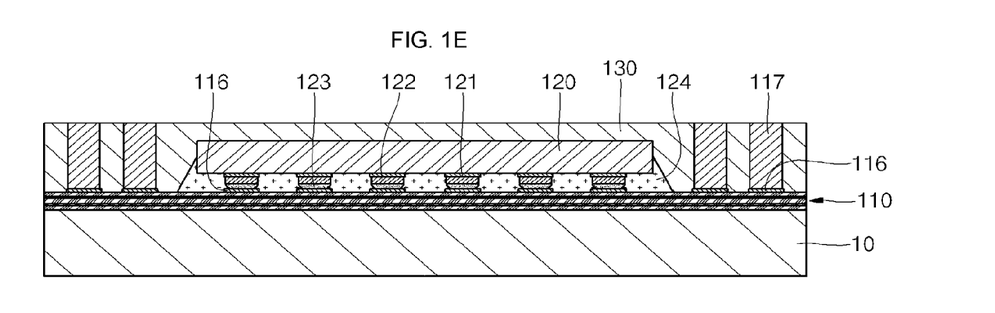
Figure 1F:
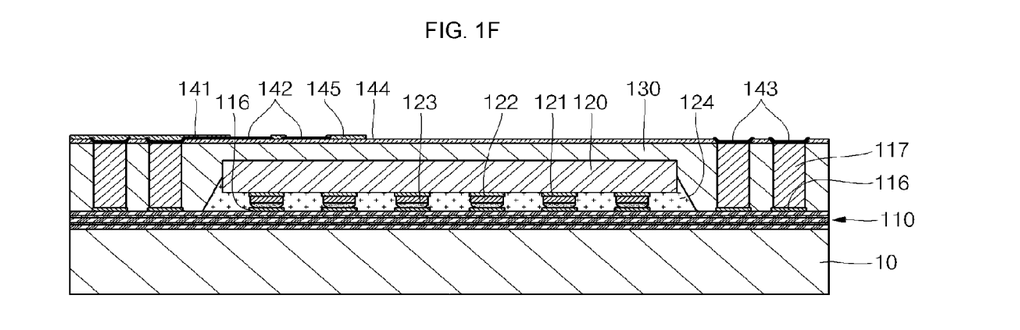
Figure 1G:
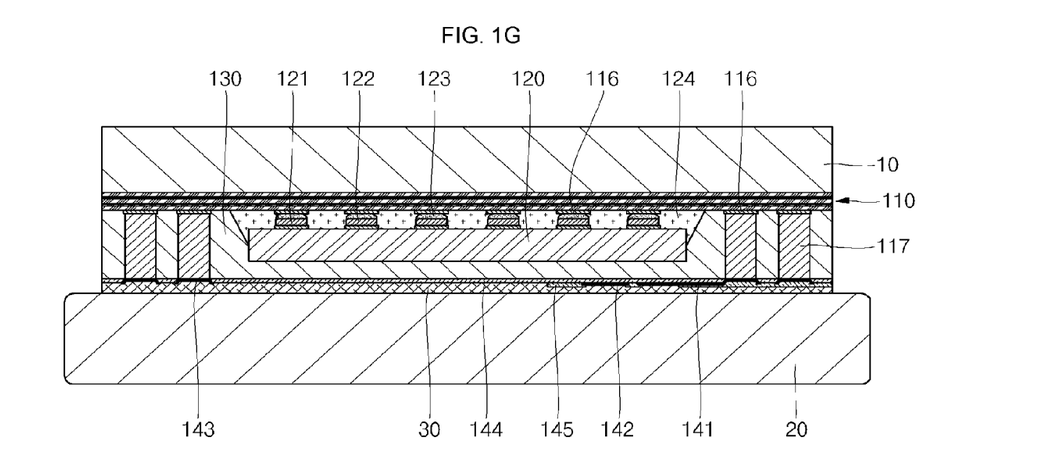
Figure 1H:
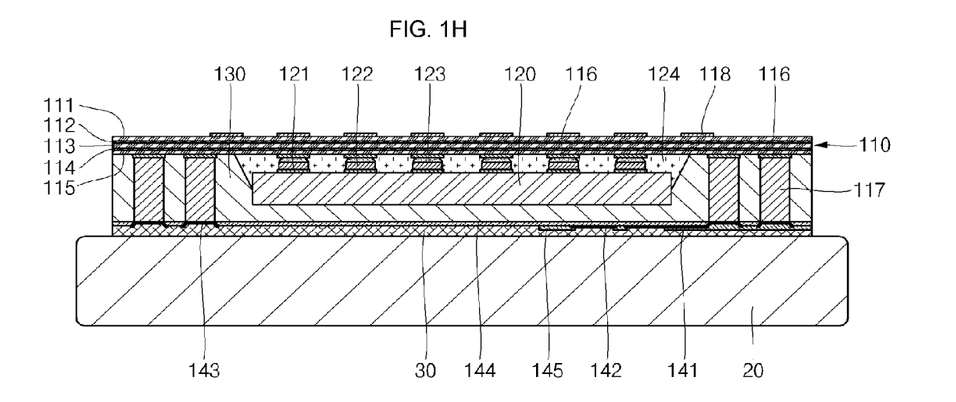
Figure 1I:
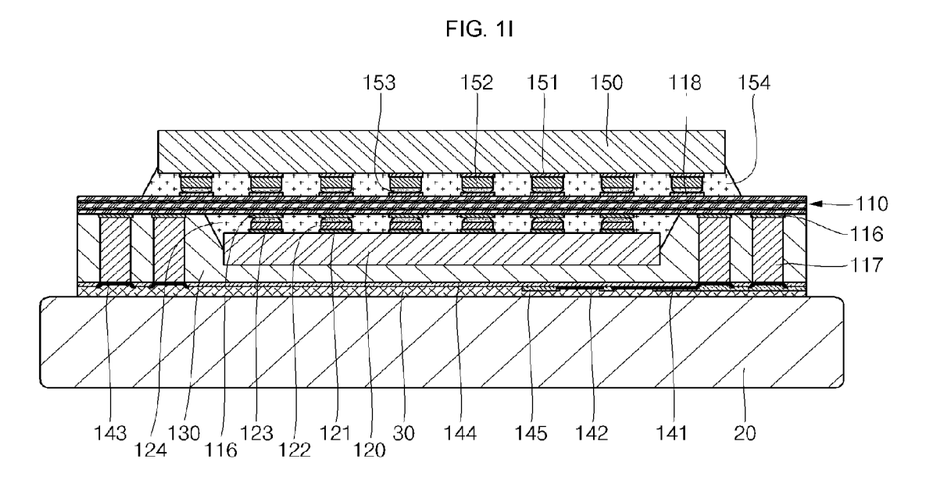
Figure 1J:
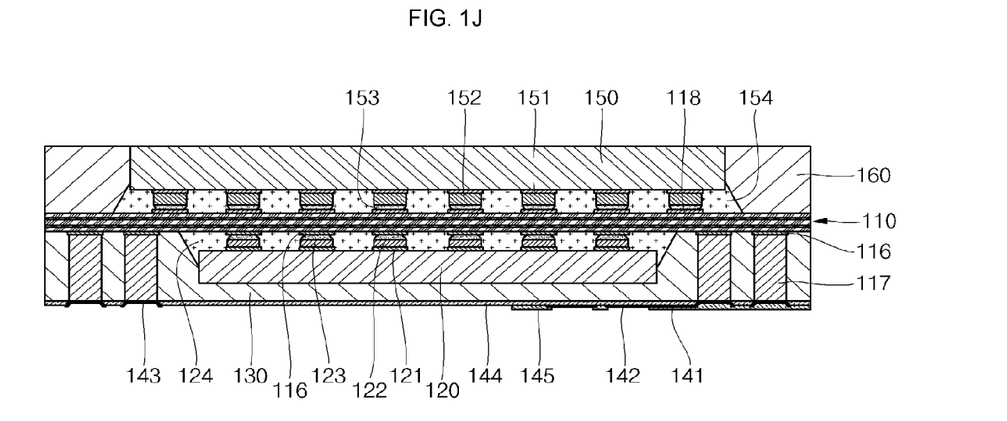
Figure 1K:
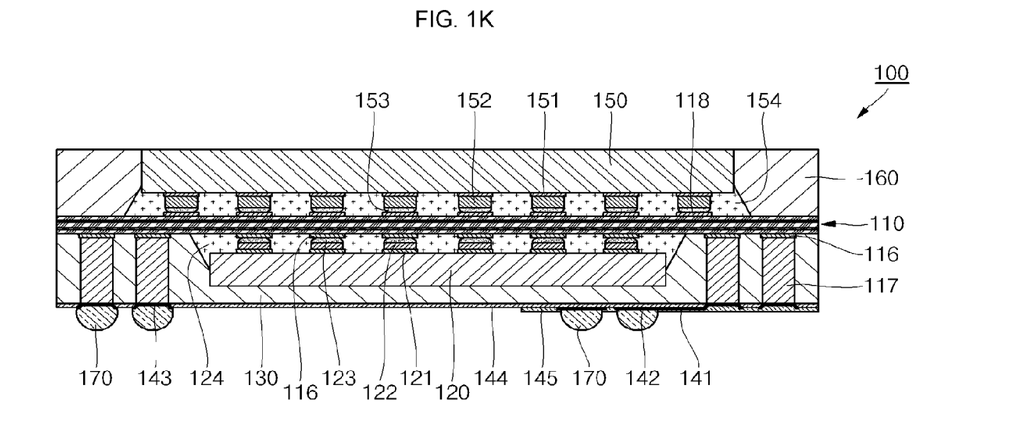

The method of manufacturing a semiconductor device 100 according to an embodiment of the present disclosure includes providing a wafer (FIG. 1A), providing a signal distribution structure having a first surface and a second surface (FIG. 1B), forming a first pad and a first post on a first surface of the signal distribution structure (FIG. 1C), connecting a first semiconductor die to the first pad (FIG. 1D), encapsulating the first semiconductor die and the first post using a first encapsulant (FIG. 1E), forming a first redistribution structure and/or a first pad on the first post (FIG. 1F), connecting a carrier (FIG. 1G), forming a second pad on the second surface of the signal distribution structure after removing a wafer (FIG. 1H), connecting a second semiconductor die to the second pad (FIG. 1I), encapsulating the second semiconductor die using a second encapsulant and removing the carrier (FIG. 1J), and forming conductive interconnection structures (FIG. 1K).

As illustrated in FIG. 1A, a wafer 10 may be provided that comprises a silicon substrate, a glass substrate, or other support structure with a substantially planar top surface, but aspects of the present disclosure are not limited thereto. The wafer 10 may, for example, serve as a base substrate on which coating, photolithographic etching, and/or plating may be performed to form a signal distribution structure 110, an example of which is described further with respect to FIG. 1B.

FIG. 1B illustrates an example signal distribution structure 110 having a planar first surface 110$a$ (e.g., a planar first surface) and a second surface 110$b$ (e.g., a planar second surface) opposite to the first surface 110$a$ formed on the top surface of the wafer 10. In an example embodiment, the signal distribution structure 110 may be formed by providing a first dielectric layer 111 on the top surface of the wafer 10, forming a first conductive layer 112 on the first dielectric layer 111, forming a second dielectric layer 113 on the first conductive layer 112 and on the first dielectric layer 111, forming a second conductive layer 114 on the second dielectric layer 113, and forming a third dielectric layer 115 on the second conductive layer 114 and on the first dielectric layer 111. In addition, although not shown, the first conductive layer 112 and the second conductive layer 114 may be electrically connected to each other by a conductive via, for example through the second dielectric layer 112 (not shown). Further, the first and second conductive layers 112 and 114, the first, second and third dielectric layers 111, 113 and 115 and the conductive via (not shown) may be formed by general coating, photolithographic etching and/or plating, as described above.

In an example embodiment, the signal distribution structure 110 may be formed on the wafer 10 using a wafer fabrication process and/or a bumping process but then is removed from the wafer, i.e., there is no support substrate or die. Accordingly, the signal distribution structure 110 may have a linewidth in a range of 1 µm to 10 µm, and the thickness of the conductive and dielectric layers may be 1-10 µm. In contrast, since a printed circuit board is formed by a substrate assembling process, it has a linewidth that is substantially greater. In addition, the signal distribution structure 110 according to the present disclosure does not have a thick, hard layer, such as a core, unlike printed circuit boards, i.e., the signal distribution structure is "coreless." Therefore, the coreless aspect of the signal distribution structure 110 enables a smaller linewidth and reduced overall package thickness.

In an example embodiment, two conductive layers and three dielectric layers are illustrated, but aspects of the present disclosure are not limited thereto. For example, the signal distribution structure 110 may be formed with any number of conductive layers and/or dielectric layers. For example, the signal distribution structure 110 may comprise a single conductive layer and two dielectric layers, three conductive layers and four dielectric layers, etc.

The first and second conductive layers 112 and 114 and the conductive via may comprise copper, a copper alloy, aluminum, an aluminum alloy, and similar materials, for example, but aspects of the present disclosure are not limited thereto. In addition, first, second, and third dielectric layers 111, 113 and 115 may comprise bismaleimidetriazine (BT), phenolic resin, polyimide (PI), benzocyclobutene (BCB), polybenzoxazole (PBO), epoxy, silicon oxide, silicon nitride, and similar materials, for example, but aspects of the present disclosure are not limited thereto.

In an example scenario in which the first, second, and/or third dielectric layers 111, 113 and 115 comprise organic materials, they may be formed by screen printing, spin coating, or other similar processes, but aspects of the present disclosure are not limited thereto. In another example scenario, in which the first, second and third dielectric layers 111, 113 and 115 comprise inorganic materials, they may be formed by chemical vapor deposition (CVD), physical vapor deposition (PVD), or other similar processes, but aspects of the present disclosure are not limited thereto. The first and second conductive layers 112 and 114 may be formed by metal deposition, metal evaporation, metal sputtering, and similar processes, but aspects of the present disclosure are not limited thereto.

As illustrated in FIG. 1C, the first pad 116 and the first post 117 may be formed on and/or connected to the first surface 110a of the signal distribution structure 110, for example, to the second conductive layer 114. More specifically, a plurality of first pads 116 may be positioned on the first surface 110a of the signal distribution structure 110 in a matrix configuration. Also, a plurality of first posts 117 may be formed on a plurality of the first pads 116, which may be positioned around a periphery (e.g., at or near an edge) of the first surface 110a of the signal distribution structure 110.

The first post 117 may, for example, be taller (e.g., longitudinally thicker) than the first pad 116, and may be formed to have a height (e.g., a longitudinal thickness) that is greater than or equal to a thickness of the first semiconductor die 120 (See, e.g., FIG. 1D).

The first pad 116 and/or the first post 117 may be formed by general plating and photolithographic etching and may comprise copper, a copper alloy, aluminum, an aluminum alloy, or similar materials, but aspects of the present disclosure are not limited thereto.

As illustrated in FIG. 1D, a first semiconductor die 120 may be electrically connected to the first pad 116, which may be centrally located on the signal distribution structure 110. The first semiconductor die 120 may comprise a bond pad 121 on an active surface of the die where at least one active device is located. A conductive pillar 122 and a solder cap 123 may be formed on the bond pad 121 for electrically coupling to the die 120. The solder cap 123 may be electrically connected to the first pad 116 by a reflow process. In addition, a solder bump may be formed on the bond pad 121. The solder bump may be electrically connected to the first pad 116 by a reflow process. In an example embodiment, the conductive pillar 122 and the solder cap 123 may be formed with smaller widths than solder bumps. Thus, for fine pitch, the conductive pillar 122 and the solder cap 123 may be utilized as opposed to solder bumps. Note that the scope of this disclosure is not however limited to any particular type of interconnection structure(s) that may be utilized to attached the first semiconductor die 120 to the signal distribution structure 110.

In addition, in order to stably fix the first semiconductor die 120 after the reflow process is completed, a first underfill 124 may be formed between the first semiconductor die 120 and the signal distribution structure 110. The first underfill 124 may cover the conductive pillar 122 and the solder cap 123, thereby enhancing the reliability in the electrical connection between the signal distribution structure 110 and the first semiconductor die 120. Such first underfill 124 may be formed in any of a variety of manners, for example by capillary underfilling. Note that the underfill 124 may also be formed while the first semiconductor die 120 is being placed and/or attached to the signal distribution structure 110, for example utilizing a pre-applied underfill. Also note that the first semiconductor die 120 may be underfilled during a molding process, for example by molded underfilling As illustrated in FIG. 1E, the first semiconductor die 120 and the first post 117 may be encapsulated using the first encapsulant 130, which may protect the first semiconductor die 120 and the first post 117 from the external environment. In an example scenario, the first encapsulant 130 may also encapsulate the first underfill 124. Alternatively, as discussed herein, the first encapsulant 130 may also provide the first underfill 124. A top surface of the first post 117 may be exposed to the outside from a top surface of the first encapsulant 130, thereby allowing the first redistribution structure 141 and/or the first bump pad 143 to later be connected to the first post 117 (See e.g., FIG. 1F). The top surface of the first post 117 and the top surface of the first encapsulant 130 may be coplanar and may be substantially planar, though such coplanarity is not necessary. During the encapsulating, the first encapsulant 130 may encapsulate the top surface of the first post 117. However, the top surface of the first post 117 may be exposed from and/or protrude to the outside of the first encapsulant 130 by grinding and/or etching. Note that the top surface of the first post 117 may be revealed by forming a via through the first encapsulant (e.g., by mechanical and/or laser ablation, etc.).

As illustrated in FIG. 1F, a first redistribution structure 141 and/or first bump pad 143 may be electrically connected to the first post 117, for example to a top surface of the first post 117. In an example embodiment, the first redistribution structure 141 may comprise one or more conductive layers and dielectric layers to redistribute electrical connections laterally (e.g., laterally over the top surface of the first encapsulant 130). In the example illustration in FIG. 1F, the first redistribution structure may be electrically connected to one or more of the first posts 117 to the left of the first semiconductor die 120, and the first bump pad 143 may be electrically connected to one or more of the first posts 117 to the right of the first semiconductor die 120. The conductive layers in the first redistribution structure 141 may comprise copper, a copper alloy, aluminum, an aluminum alloy, and similar materials, for example, but aspects of the present disclosure are not limited thereto.

The conductive layers in the first redistribution structure 141 may, for example, be formed or deposited using utilizing any one or more of a variety of processes (e.g., electrolytic plating, electroless plating, chemical vapor deposition (CVD), sputtering or physical vapor deposition (PVD), plasma vapor deposition, printing, etc.). In addition, dielectric layers in the redistribution structure 141 may comprise bismaleimidetriazine (BT), phenolic resin, polyimide (PI), benzocyclobutene (BCB), polybenzoxazole (PBO), epoxy, silicon oxide, silicon nitride, and similar materials, for example, but aspects of the present disclosure are not limited thereto. The dielectric layers in first redistribution structure 141 may be formed using any one or more of a variety of dielectric forming or deposition processes, for example printing, spin coating, spray coating, sintering, thermal oxidation, physical vapor deposition (PVD), chemical vapor deposition (CVD), plasma vapor deposition, sheet lamination, etc.

A first dielectric layer 144 (which may also be referred to herein as a protection layer) may be formed on a surface of first encapsulant 130, for example around a periphery of the first post 117, and a first conductive layer of the first redistribution structure 141 and the first bump pad 143 may then be formed. A region of the first conductive layer, which is not required to be exposed to the outside, may be covered by the second dielectric layer 145 (which may also be referred to herein as a protection layer). The first and second dielectric layers 144 and 145 may comprise dielectric layers that electrically isolate conductive layers and may comprise general bismaleimidetriazine (BT), phenolic resin, polyimide (PI), benzocyclobutene (BCB), polybenzoxazole (PBO), epoxy, silicon oxide, silicon nitride or similar materials, but aspects of the present disclosure are not limited thereto. The first and second dielectric layers 144 and 145 may be formed by chemical vapor deposition (CVD), physical vapor deposition (PVD), or other similar deposition process, but aspects of the present disclosure are not limited thereto.

In an example embodiment, the first redistribution structure 141 may be of a fan-in type that extends from the outside to the inside (e.g., distributing signals from outside of the footprint of the first semiconductor die 120 to within the footprint of the first semiconductor die 120). Accordingly, a first land 142 exposed to the outside may be positioned on (or over) the first semiconductor die 120. In such a manner, conductive bumps 170 (or any of a variety of types of interconnection structures) may later be electrically connected to the first land 142 and the first pad 143.

The conductive layer(s) of the first redistribution structure 141 and the first bump pad 143 may, for example, comprise copper, a copper alloy, aluminum, an aluminum alloy, or similar materials, and may be formed by general coating, photolithographic etching, and/or plating, but aspects of the present disclosure are not limited thereto.

In the example implementation shown in FIG. 1F, the first and second dielectric layers 144 and 145 are formed on the left region of the drawing (e.g., left of the center of the first semiconductor device 120, left of the rightmost quarter of the first semiconductor device 120, left of the rightmost three quarters of the first semiconductor device 120, etc.), while only the first protection layer 144 is formed on the substantially right region of the drawing (e.g., right of the center of the first semiconductor device 120, right of the leftmost quarter of the first semiconductor device 120, right of the leftmost three quarters of the first semiconductor device 120, etc.), thereby implementing an asymmetric device. Note that such asymmetrical dielectric layer formation is not required.

As illustrated in FIG. 1G, the structure is overturned and a carrier 20 is then temporarily adhered to a bottom surface of the overturned device. Accordingly, a temporary adhesive 30 may be applied to the first pad 143, and the first redistribution structure 141 (e.g., including exposed conductive and/or dielectric layers thereof), and the carrier 20 may then be affixed. The temporary adhesive 30 may be formed by screen printing, spin coating, or similar processes, but aspects of the present disclosure are not limited thereto. In addition, the temporary adhesive 30 may be a thermal release tape, but aspects of the present disclosure are not limited thereto. The carrier 20 may comprise stainless steel, glass, a dummy semiconductor wafer (e.g., free of functional semiconductor devices), a porous ceramic, or similar materials, but aspects of the present disclosure are not limited thereto.

As illustrated in FIG. 1H, the wafer 10 used in forming the signal distribution structure 110 may be removed. The second pad 118 (or a plurality thereof) may be formed on the second surface 110b of the signal distribution structure 110 exposed to the outside as a result of the removal wafer 10. In this example, the wafer 10 may be completely removed from the signal distribution structure 110 through grinding and etching, though the scope of this disclosure is not limited thereto. The second pad 118 may then formed by photolithographic etching and plating, though the scope of this disclosure is not limited thereto. The second pad 118 may, for example, be electrically connected to the first conductive layer 112 of the signal distribution structure 110. Although not shown, when necessary, the peripheral region of the second pad 118 may be covered by an additional dielectric layer (which may also be referred to herein as a protection layer).

As illustrated in FIG. 1I, the second semiconductor die 150 may be electrically connected to the second pad 118 positioned in the above-described manner. For example, the second semiconductor die 150 may comprise a bond pad 151, and a conductive pillar 152 and a solder cap 153 may be formed on the bond pad 151. The solder cap 153 may be electrically connected to the second pad 118 by a reflow process. In addition, a solder bump may be formed on the bond pad 151. The solder bump may be electrically connected to the second pad 118 by a reflow process. Note that the scope of this disclosure is not however limited to any particular type of interconnection structure(s) that may be utilized to attached the second semiconductor die 150 to the signal distribution structure 110.

In addition, in order to stably fix the second semiconductor die 150 after the process is completed, a second underfill 154 may be formed between the second semiconductor die 150 and the signal distribution structure 110. In an example scenario, the second underfill 154 may cover side surfaces of the conductive pillar 152 and the solder cap 153. Such second underfill 154 may be formed in any of a variety of manners, for example by capillary underfilling. Note that the underfill 124 may also be formed while the first semiconductor die 120 is being placed and/or attached to the signal distribution structure 110, for example utilizing a pre-applied underfill. Also note that the first semiconductor die 120 may be underfilled during a molding process, for example by molded underfilling.

As illustrated in FIG. 1J, the second semiconductor die 150 may be encapsulated by the second encapsulant 160, thereby protecting the second semiconductor die 150 from the external environment. In an example scenario, the second encapsulant 160 may also encapsulate the second underfill 154. Alternatively, as discussed herein, the second encapsulant 160 may also provide the second underfill 154. In addition, a top surface of the second semiconductor die 150 may be exposed to the outside from a top surface of the second encapsulant 160, thereby improving heat conduction out of the die. The top surface of the second semiconductor die 150 and the top surface of the second encapsulant 160 may be coplanar and may be substantially planar. In another example scenario, the top surface of the second semiconductor die 150 may be completely encapsulated by the second encapsulant 160.

The carrier 20 may then be removed utilizing any or a variety of techniques. For example, heat or UV light may be supplied to eliminate adhesiveness of the temporary adhesive 30, thereby removing the carrier 20. Alternatively, the carrier 20 may first be removed by grinding and/or etching and the temporary adhesive 30 may then be removed using a chemical solution.

In an example implementation in which the temporary adhesive 30 is removed using a chemical solution, the carrier 20 may comprise a porous ceramic so as to provide for the chemical solution to rapidly reach the temporary adhesive 30. The carrier 20 and the temporary adhesive 30 may then be physically released from the device.

As illustrated in FIG. 1K, in the forming of conductive interconnection structures (e.g., conductive bumps, balls, pillars, wires, etc.), the conductive interconnection structures 170 may be electrically connected to the first land 142 of the first redistribution structure 141 and the first pad 143, which are exposed as a result of the removing of the carrier 20 and the temporary adhesive 30. In an example embodiment, a volatile flux may be formed (e.g., dotted) on the first land 142 and the first pad 143 and the conductive interconnection structures 170 (e.g., conductive bumps or balls) may then be temporarily attached to the volatile flux. Thereafter, the device may be transferred to a furnace maintained at a temperature in a range of about 160° C. to about 250° C. Accordingly, the volatile flux may be volatilized to then be removed, and the conductive interconnection structures 170 may be electrically connected to the first land 142 and the first pad 143, respectively. Thereafter, the conductive interconnection structures 170 may be cured by cooling.

The conductive interconnection structures 170 may comprise eutectic solders (e.g., $Sn_{37}Pb$), high-lead solders (e.g., $Sn_{95}Pb$) having a high melting point, lead-free solders (e.g., SnAg, SnCu, SnZn, SnAu, SnZnBi, SnAgCu and SnAgBi), and similar materials, but the scope of this disclosure is not limited thereto. The conductive interconnection structures 170 may also, for example, comprise conductive pillars or posts, which may comprise copper, nickel, silver, aluminum, etc. and may be formed by plating, sputtering, etc.

In addition, before or after the forming of the conductive interconnection structures 170, a laser marking process may be performed, for example marking the kind of device, the manufacturer's name, the production date, etc., on a surface of the second semiconductor die 150.

The above-described embodiment has been described with regard to only a single semiconductor device 100. In practice, a plurality of semiconductor devices 100 may be simultaneously formed. After the forming of the conductive interconnection structures 170, a sawing (or other singulating) process may be performed to separate the resultant product into individual semiconductor devices 100. The sawing process may, for example, be performed by sequentially sawing at least the first encapsulant 130, the signal distribution structure 110 and the second encapsulant 160 using a laser or a diamond blade.

As described above, in accordance with various aspects of the present disclosure, a semiconductor device and a method of manufacturing thereof are provided, which provide for electrically connecting semiconductor dies having different pattern widths to each other using a signal distribution structure. In an example embodiment, the first semiconductor die 120 may be a high-tech semiconductor die having nanoscale pattern widths and the second semiconductor die 150 may be a low-tech semiconductor die having microscale pattern widths. The first semiconductor die 120 and the second semiconductor die 150 may be electrically connected to each other through the signal distribution structure 110.

In addition, according to the present disclosure, there is provided a semiconductor device, which has a low manufacturing cost and has a small thickness using the signal distribution structure 110 without through silicon vias, and a manufacturing method thereof. In an example embodiment, the signal distribution structure 110 comprises conductive layers and conductive vias while not including through silicon vias, which may be costly and reduce yields.

Further, according to the present disclosure, there is provided a semiconductor device, which is manufactured without using through silicon vias and/or a printed circuit board, and a manufacturing method thereof. The semiconductor device may, for example, be a fan-in and/or fan-out wafer level semiconductor device.

In addition, according to the present disclosure, there is provided a semiconductor device, which can adjust or maintain warpage balance by attaching semiconductor dies to top and bottom surfaces of a signal distribution structure, and the manufacturing method thereof.

Figure 2:
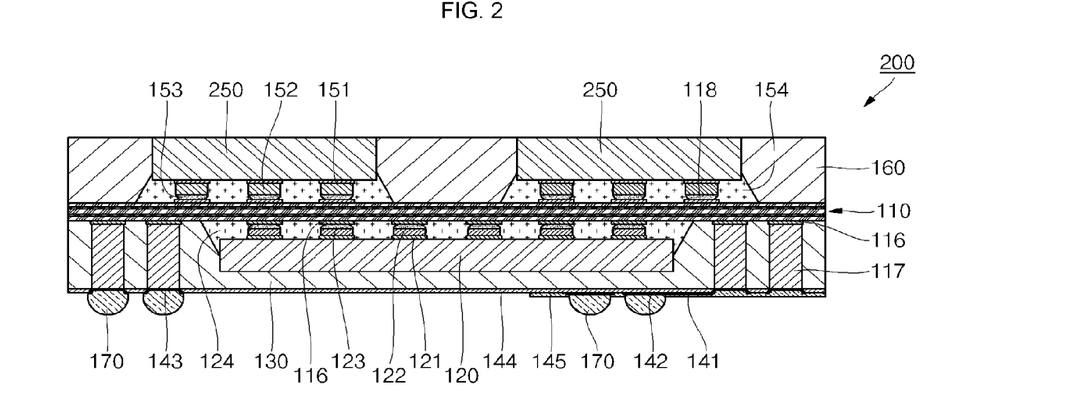
FIG. 2 is a cross-sectional view illustrating a semiconductor device according to another embodiment of the present disclosure.

Referring to FIG. 2, a cross-sectional view illustrating a semiconductor device 200 according to another embodiment of the present disclosure is illustrated. The example semiconductor device 200 may, for example, share any or all characteristics with the example semiconductor device 100, and/or method of manufacturing thereof, shown in FIGS. 1A-1K.

As illustrated in FIG. 2, the semiconductor device 200 according to the present disclosure may include a plurality of second semiconductor die 250. The respective semiconductor die 250 may be electrically connected to the second pad 118 of the signal distribution structure 110 through the conductive pillar 152 and the solder cap 153 or solder bumps. The signal distribution structure 110 may, for example, provide signal paths between any one or more of the second semiconductor die 250 and one or more other of the second semiconductor die 250. Also for example, the signal distribution structure 110 may provide signal paths between any one or more of the second semiconductor die 250 and the first semiconductor die 120. Additionally for example, the signal distribution structure may provide signal paths (or respective portions thereof) between one or more of the plurality of second semiconductor die 250 and the conductive interconnection structures 170 (and thus to another device to which the semiconductor device 200 is coupled.

In addition, the second underfill 154 may be formed between each of the semiconductor die 250 and the signal distribution structure 110.

In such a manner, the plurality of semiconductor dies 250, each having an intrinsic function which may be the same or different, may be connected to one single signal distribution structure 110, thereby providing the semiconductor device 200 having various functions.

Figure 3:
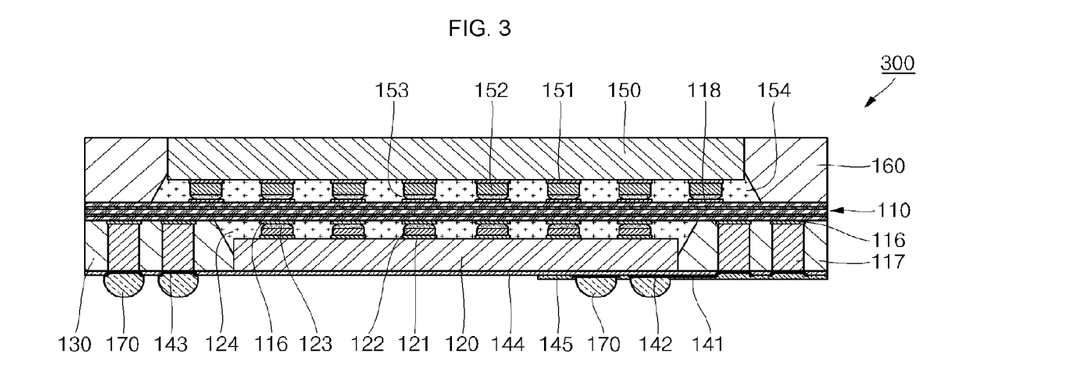
FIG. 3 is a cross-sectional view illustrating a semiconductor device according to still another embodiment of the present disclosure.

Referring to FIG. 3, a cross-sectional view illustrating a semiconductor device 300 according to still another embodiment of the present disclosure is illustrated. The example semiconductor device 300 may, for example, share any or all characteristics with the example semiconductor devices 100 and 200, and/or methods of manufacturing thereof, shown in FIGS. 1A-1K and FIG. 2.

As illustrated in FIG. 3, the semiconductor device 300 is configured such that a bottom surface of a first semiconductor die 120 is not completely encapsulated by the first encapsulant 130, for example only side surfaces of the first semiconductor die 120 are encapsulated by the first encapsulant 130, but the bottom surface of the first semiconductor die 120 is not encapsulated by the first encapsulant 130. In this example, the bottom surface of the first semiconductor die 120 and a bottom surface of the first encapsulant 130 are coplanar.

The first dielectric layer 144 and/or first and second protection layers 144 and 145 may be formed on the bottom surface of the first semiconductor die 120, for example instead of on the bottom surface of the first encapsulant 130 as shown in FIG. 1F. A first conductive layer of the first redistribution structure 141 and a first land 142 may be formed between the first dielectric layer 144 and the second dielectric layer 145 (e.g., exposed through an aperture in the second dielectric layer 145), and a conductive interconnection structure 170 may be connected to the first land 142.

In such a manner, the present disclosure provides the semiconductor device 300, which has a small thickness and improved heat radiating performance by covering the bottom surface of the first semiconductor die 120 (or a portion thereof) by the first protection layer 144 and/or first and second protection layers 144 and 145, which may comprise thin layers, without being encapsulated by the first encapsulant 130.

Figure 4:
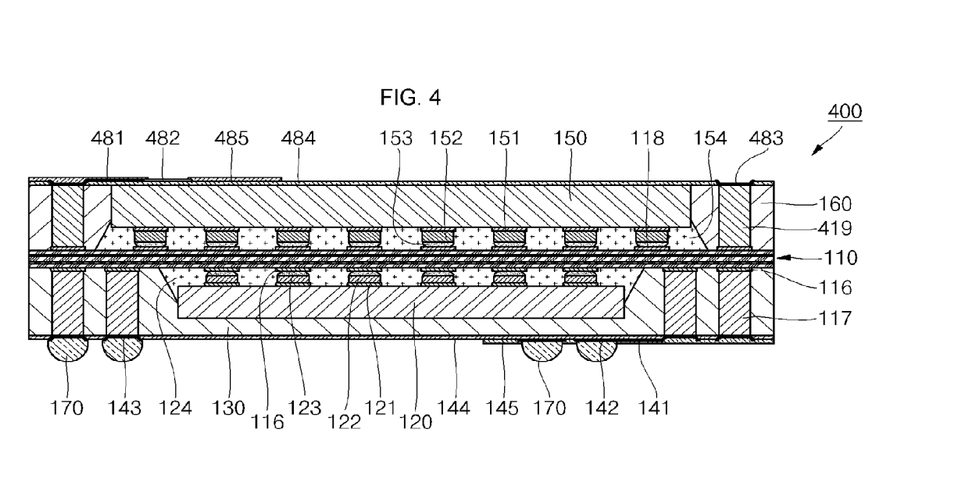
FIG. 4 is a cross-sectional view illustrating a semiconductor device according to still another embodiment of the present disclosure.

Referring to FIG. 4, a cross-sectional view illustrating a semiconductor device 400 according to still another embodiment of the present disclosure is illustrated. The example semiconductor device 400 may, for example, share any or all characteristics with the example semiconductor devices 100, 200 and 300, and/or methods of manufacturing thereof, shown in FIGS. 1A-1K, 2 and 3. As illustrated in FIG. 4, the semiconductor device 400 comprises a second post 419 formed on the second surface 110b of the signal distribution structure 110, and a second redistribution structure 481, and/or a second bump 483 connected to the second post 419.

The second post 419 may be formed on a second pad 118 connected to the second surface 110b of the signal distribution structure 110, for example, a first conductive layer 112. More specifically, a plurality of second pads 118 may be arranged on the second surface 110b of the signal distribution structure 110 in a matrix configuration. Also, a plurality of the second posts 419 may be formed on a plurality of the second pads 118, which in this example are positioned around a periphery (e.g., at or near an edge) of the second surface 110b of the signal distribution structure 110.

The second pad 118 and/or the second post 419 may be formed by general plating or photolithographic etching and may comprise copper, a copper alloy, aluminum, an aluminum alloy, or similar material, but aspects of the present disclosure are not limited thereto.

In addition, in an example embodiment, the second redistribution structure 481 may be electrically connected to one or more of the second posts 419 to the left of the second semiconductor die 150, and the second bump pad 483 may be electrically connected to one or more of the second posts 419 to the right of the second semiconductor die 150. A first dielectric layer 484 may be first formed on surfaces of the second encapsulant 160 and the second semiconductor die 150 with an opening for the second post 419. A second pad 483 and/or a first conductive layer of the second redistribution structure 481 may then be formed, and a region first conductive layer of the second redistribution structure 481, which is not required to be exposed to the outside, may be covered by the second dielectric layer 485.

In an example embodiment, the second redistribution structure 481 is of a fan-in type that extends from the outside to the inside (e.g., distributing signals from outside of the footprint of the second semiconductor die 150 to within the footprint of the second semiconductor die 150). Accordingly, a second land 482 exposed to the outside may be positioned on (or over) a top surface of the second semiconductor die 150. In this manner, different semiconductor devices (not shown) may later be mounted on the second land 482 of the second redistribution structure 481 and the second bump pad 483. Accordingly, FIG. 4 illustrates a package-on-package (POP) type semiconductor device 400.

First and second dielectric layers 484 and 485 may be formed on the substantially left region of the drawing (e.g., left of the center of the first semiconductor device 120, left of the rightmost quarter of the first semiconductor device 120, left of the rightmost three quarters of the first semiconductor device 120, etc.) and the first dielectric layer 484 may be formed on the substantially right region of the drawing (e.g., right of the center of the first semiconductor device 120, right of the leftmost quarter of the first semiconductor device 120, right of the leftmost three quarters of the first semiconductor device 120, etc.), thereby implementing an asymmetric device.

Figure 5:
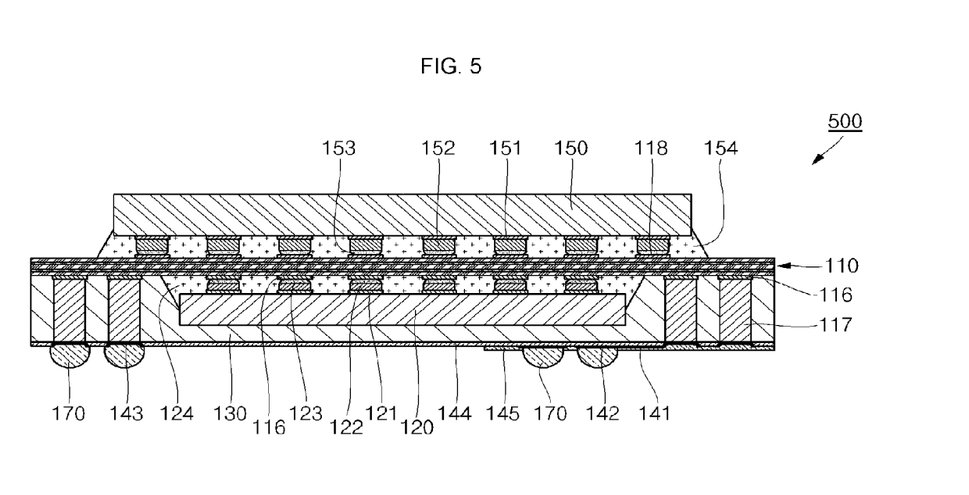
FIG. 5 is a cross-sectional view illustrating a semiconductor device according to still another embodiment of the present disclosure.

Referring to FIG. 5, a cross-sectional view illustrating a semiconductor device 500 according to still another embodiment of the present disclosure is illustrated. The example semiconductor device 400 may, for example, share any or all characteristics with the example semiconductor devices 100, 200, 300 and 400, and/or methods of manufacturing thereof, shown in FIGS. 1A-1K, 2, 3 and 4.

As illustrated in FIG. 5, the semiconductor device 500 comprises a second semiconductor die 150 exposed to the outside. In this manner, top and side surfaces of the second semiconductor die 150 are not encapsulated by a second encapsulant 160 but are exposed to the outside. A second underfill 154 may be filled between the second semiconductor die 150 and a signal distribution structure 110.

In such a manner, the present disclosure provides the semiconductor device 500, which has improved heat radiating performance by completely exposing the top and side surfaces of the second semiconductor die 150. Note that the second underfill 154 may contact at least a portion of the side surfaces of the second semiconductor die 150.

The present disclosure provides a semiconductor package using a coreless signal distribution structure. The coreless signal distribution structure may comprise at least one dielectric layer, at least one conductive layer, a first surface, and a second surface opposite to the first surface. The semiconductor package may also comprise a first semiconductor die having a first bond pad on a first die surface, where the first semiconductor die is bonded to the first surface of the coreless signal distribution structure via the first bond pad, and a second semiconductor die having a second bond pad on a second die surface, where the second semiconductor die is bonded to the second surface of the coreless signal distribution structure via the second bond pad. The semiconductor package may further comprise a first encapsulant material encapsulating side surfaces of the first semiconductor die and a portion of the first surface of the coreless signal distribution structure, as well as a redistribution structure on the first encapsulant, where the redistribution structure comprises at least one conductive layer and at least one dielectric layer.

A first metal post may be on the coreless signal distribution structure adjacent to a first edge of the first semiconductor die, where the first metal post extends through the encapsulant material. A second metal post may be on the coreless signal distribution structure adjacent to a second edge of the first semiconductor die, where the second metal post extends through the encapsulant material. The redistribution structure may be electrically coupled to the first metal post and an interconnection structure on the first encapsulant.

A dielectric layer of the redistribution structure may contact the first metal post and the interconnection structure but not the second metal post. The interconnection structure may comprise a conductive bump. A second metal post may be coupled to the coreless signal distribution structure and extend through the second encapsulant material. A second encapsulant may encapsulate the second semiconductor die and is coplanar with a surface of the second semiconductor die opposite the second die surface.

Embodiments of the present disclosure provide a semiconductor device, which implements a manufacturing method thereof, by electrically connecting semiconductor dies having different pattern widths, to each other using a signal distribution structure. Embodiments of the present disclosure provide a semiconductor device, which has a low manufacturing cost and has a small thickness using a signal distribution structure without TSVs, and a manufacturing method thereof.

Embodiments of the present disclosure provide a semiconductor device, which can be manufactured without using TSVs and/or a printed circuit board, and can manufacture a fan-in and/or fan-out wafer level package and/or a package-on-package (POP), and a manufacturing method thereof. Embodiments of the present disclosure provide a semiconductor device, which can adjust or maintain warpage balance of a package, and a manufacturing method thereof, by attaching semiconductor die to top and bottom surfaces of a signal distribution structure.

According to an aspect of the present disclosure, there is provided a method of manufacturing a semiconductor device, the manufacturing method including forming a signal distribution structure having a first surface and a second surface on a surface of a wafer and forming a first pad and a first post on the first surface of the signal distribution structure, electrically connecting a first semiconductor die to the first pad of the signal distribution structure, encapsulating the first post and the first semiconductor die using a first encapsulant, attaching a carrier to the first encapsulant and removing the wafer, forming a second pad on the second surface of the signal distribution structure and electrically connecting a second semiconductor die to the second pad, and forming a conductive interconnection structure on the first post after removing the carrier.

According to another aspect of the present disclosure, there is provided a semiconductor device including a signal distribution structure having a first surface and a second surface, where the first surface includes a first pad and a first post formed thereon and the second surface includes a second pad formed thereon. The semiconductor device also includes a first semiconductor die electrically connected to the first pad of the signal distribution structure, a first encapsulant encapsulating the first post and the first semiconductor die, a second semiconductor die electrically connected to the second pad of the signal distribution structure, and a conductive interconnection structure electrically connected to the first post.

As described above, in a semiconductor device according to embodiments of the present disclosure and a manufacturing method thereof, a process is implemented that electrically connects semiconductor die for having different pattern widths to each other using a signal distribution structure. In an example embodiment, a semiconductor die having nano-scale patterns is electrically connected to a top surface of the signal distribution structure, and another semiconductor die having micro-scale patterns is electrically connected to a bottom surface of the signal distribution structure.

In addition, in the semiconductor device according to embodiments of the present disclosure and the manufacturing method thereof, the semiconductor device can be manufactured at a low cost and has a small thickness using a signal distribution structure without through silicon vias. In an example embodiment, the signal distribution structure comprises conductive layers, dielectric layers and conductive vias while not including TSVs, thereby providing the semiconductor device having a reduced thickness at a low manufacturing cost.

Further, in a semiconductor device according to embodiments of the present disclosure and a manufacturing method thereof, the semiconductor device can be manufactured without using TSVs or a printed circuit board, and a fan-in and/or fan-out wafer level package and/or a package-on-package (POP) can be manufactured. In an example embodiment, the present disclosure provides a package-on-package (POP) device fabricated by preparing a wafer level package having a fan-in and/or fan-out redistribution structure electrically connected to a conductive post, or preparing another conductive post and mounting another package on the conductive post by another redistribution structure electrically connected to the conductive post.

In addition, in a semiconductor device according to embodiments of the present disclosure and a manufacturing method thereof, warpage balance can be adjusted or maintained by attaching semiconductor die to top and bottom surfaces of a signal distribution structure. In an example embodiment, the present disclosure provides a semiconductor device, which has a reduced difference between thermal expansion coefficients of the top and bottom surfaces of the signal distribution structure by attaching semiconductor die having substantially the same size and/or thickness to the top and bottom surfaces of the signal distribution structure, thereby preventing warpage.

While various aspects supporting the disclosure have been described with reference to certain example embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular example embodiments disclosed, but that the present disclosure will include all embodiments falling within the scope of the appended claims.

What is claimed is:

1. A semiconductor device comprising:
   a coreless signal distribution structure comprising at least one dielectric layer, at least one conductive layer, a first surface, and a second surface opposite to the first surface;
   a first semiconductor die having a first bond pad on a first die surface, the first semiconductor die bonded to the first surface of the coreless signal distribution structure via the first bond pad;
   a second semiconductor die having a second bond pad on a second die surface, the second semiconductor die bonded to the second surface of the coreless signal distribution structure via the second bond pad;
   a metal post electrically coupled to the first surface of the coreless signal distribution structure; and
   a first encapsulant material encapsulating side surfaces and a surface opposite the first die surface of the first semiconductor die, the metal post, and a portion of the first surface of the coreless signal distribution structure.

2. The semiconductor device according to claim 1, wherein the metal post comprises copper and extends through the encapsulant material.

3. The semiconductor device according to claim 1, comprising a second encapsulant material encapsulating the second semiconductor die.

4. The semiconductor device according to claim 3, comprising a second metal post coupled to the coreless signal distribution structure and extending through the second encapsulant material.

5. The semiconductor device according to claim 3, wherein a surface of the second encapsulant is coplanar with a surface of the second semiconductor die opposite the second die surface.

6. The semiconductor device according to claim 1, wherein a conductive pillar electrically couples the first bond pad of the first semiconductor die to the coreless signal distribution structure.

7. The semiconductor device according to claim 1, comprising a redistribution structure on the first encapsulant and electrically coupled to the metal post, wherein the redistribution structure comprises at least one conductive layer and at least one dielectric layer.

8. The semiconductor device according to claim 1, wherein the coreless signal distribution structure has a linewidth of 1-10 µm.

9. A semiconductor device comprising:
- a coreless signal distribution structure comprising at least one dielectric layer, at least one conductive layer, a first surface, and a second surface opposite to the first surface;
- a first semiconductor die having a first bond pad on a first die surface, the first semiconductor die bonded to the first surface of the coreless signal distribution structure via the first bond pad;
- a second semiconductor die having a second bond pad on a second die surface, the second semiconductor die bonded to the second surface of the coreless signal distribution structure via the second bond pad;
- a first encapsulant material encapsulating side surfaces of the first semiconductor die and a portion of the first surface of the coreless signal distribution structure; and
- a redistribution structure on the first encapsulant, wherein the redistribution structure comprises at least one conductive layer and at least one dielectric layer.

10. The semiconductor device of claim 9, comprising a first metal post on the coreless signal distribution structure adjacent to a first edge of the first semiconductor die, the first metal post extending through the encapsulant material.

11. The semiconductor device of claim 10, comprising a second metal post on the coreless signal distribution structure adjacent to a second edge of the first semiconductor die, the second metal post extending through the encapsulant material.

12. The semiconductor device of claim 11, wherein the redistribution structure is electrically coupled to the first metal post and an interconnection structure on the first encapsulant.

13. The semiconductor device of claim 12, wherein a dielectric layer of the redistribution structure contacts the first metal post and the interconnection structure but not the second metal post.

14. The semiconductor device of claim 12, wherein the interconnection structure comprises a conductive bump.

15. The semiconductor device of claim 9, comprising encapsulating the second semiconductor die utilizing a second encapsulant material.

16. The semiconductor device of claim 11, wherein a second encapsulant encapsulates the second semiconductor die and is coplanar with a surface of the second semiconductor die opposite the second die surface.

\* \* \* \* \*